United States Patent
Sultan et al.

[11] Patent Number: 6,063,682
[45] Date of Patent: May 16, 2000

[54] ULTRA-SHALLOW P-TYPE JUNCTION HAVING REDUCED SHEET RESISTANCE AND METHOD FOR PRODUCING SHALLOW JUNCTIONS

[75] Inventors: Akif Sultan, Santa Clara; Geoffrey Choh-Fei Yeap, Sunnyvale, both of Calif.

[73] Assignee: Advanced Micro Devices, Inc., Sunnyvale, Calif.

[21] Appl. No.: 09/049,322

[22] Filed: Mar. 27, 1998

[51] Int. Cl.[7] .................................................. H01L 21/336
[52] U.S. Cl. .......................... 438/305; 438/199; 438/228; 438/231; 438/232; 438/301; 438/306; 438/528; 438/918
[58] Field of Search ..................................... 438/199, 228, 438/229, 231, 232, 301, 305, 306, 307, 528, 918

[56] References Cited

U.S. PATENT DOCUMENTS

| | | | |
|---|---|---|---|
| 5,036,019 | 7/1991 | Yamane et al. | 438/228 |
| 5,296,401 | 3/1994 | Mitsui et al. | 438/231 |
| 5,360,749 | 11/1994 | Anjum et al. . | |
| 5,470,794 | 11/1995 | Anjum et al. . | |
| 5,541,131 | 7/1996 | Yoo et al. | 438/305 |
| 5,767,557 | 6/1998 | Kizilyalli | 257/403 |
| 5,821,147 | 10/1998 | Kizilyalli | 438/305 |
| 5,899,732 | 5/1999 | Gardner et al. | 438/528 |

*Primary Examiner*—John F. Niebling
*Assistant Examiner*—Lynne A. Gurley
*Attorney, Agent, or Firm*—Amin, Eschweiler & Turocy, LLP

[57] ABSTRACT

A method of fabricating a transistor is provided. According to the method, a heavy ion is implanted into a silicon substrate so as to amorphize at least a portion of the silicon substrate. The amorphized silicon is substantially free of channels. A dopant is subsequently implanted into the amorphized silicon, and the amorphized silicon substantially contains the implanted dopant. Thereafter, a silicon implanting step is performed to create an excess of vacancies to interstitials within a predetermined range. Enhanced diffusion of the dopant within the predetermined range is mitigated because of the excess of vacancies to interstitials within this predetermined range.

20 Claims, 4 Drawing Sheets

ULTRA-SHALLOW P-TYPE JUNCTION HAVING REDUCED SHEET RESISTANCE AND METHOD FOR PRODUCING SHALLOW JUNCTIONS

TECHNICAL FIELD

The present invention generally relates to a method for integrated circuit manufacturing. In particular, the present invention provides for a method for forming shallow junctions having reduced series resistance.

BACKGROUND OF THE INVENTION

Metal-Oxide Semiconductor (MOS) designs have become popular in logic circuit designs for numerous reasons including their noise immunity, operability over wide voltage ranges and other properties. The most common types of transistors used include NMOS and PMOS. Although historically, the PMOS transistor was developed first with large-scale production after 1967, the n-type MOSFET (NMOS) is more widely used because the mobility for electrons is 2 to 2.5 times that of holes. In other words, the "On" resistance for a p-type MOSFET is 2 to 2.5 times greater than the "On" resistance for an n-type MOSFET. Thus, to achieve a given resistance for a particular "On" state, an n-type MOSFET will require less than about half the area of a corresponding p-type MOSFET. Along with this reduction in size and increased packing density, lower capacitance is also achieved with an n-type MOSFET resulting in higher switching speeds in digital circuits. As is known, size, speed, and power consumption are some of the key elements in equipment designs today. Consequently, these natural physical characteristics of NMOS transistors deem NMOS transistors generally attractive as compared to PMOS transistors.

However, PMOS transistors are not entirely replaceable. Designs such as complimentary metal-oxide semiconductors (CMOS) require both n-type and p-type MOSFETs. Consequently, there is a need in the art for a method of fabricating ultra-shallow p-type junctions with low sheet resistance. Sheet resistance for a material is expressed as a function of layer thickness and conductivity. Thus, in general, the more thick the layer and higher the concentration the lower the sheet resistance. To eliminate short channel effects, it is necessary to have shallower junctions as device channel length is scaled down.

A p-type MOSFET is generally achieved by doping an intrinsic silicon sample with a small amount of a Column III element of the periodic table such as for example boron, gallium, or indium to create a crystalline structure. Column III elements have one too few electrons to participate in covalent bonding with surrounding silicon. To complete the covalent bond structure, an electron is attracted from the valence band and the Column III element becomes a charged negative ion. Thus, the Column III element is sometimes called an acceptor for acquiring an electron. When an electron is removed from the valence band, a net positive charge which can effectively move under the application of an external electric field is left in the valence band thus creating a hole. Because electrons are minority carriers and holes are majority carriers, current conduction in the acceptor-type MOSFET or the p-type MOSFET is primarily via holes.

When designing a p-type MOSFET low energy indium implantation is seldom chosen because it is too difficult to use in the formation of ultra-shallow junctions as a result of the indium out-diffusing almost completely during annealing. On the other hand, boron is typically employed in ultra-shallow junction formation. However, to obtain ultra shallow p-type junctions using boron is rather difficult. Boron is a light atom (atomic weight 10.81) and is subject to significant channeling and enhanced diffusion. It is essential to scale down junction depth as the channel length is scaled down. Deeper junctions lead to adverse short channel effects which degrade transistor performance. More particularly, channeling occurs during implantation before heat treatment. Theoretically, boron should distribute around a projected range, or a center of distribution in accordance with a standard of deviation for distribution. However, due to boron's light weight the boron atom may travel further and deeper during implantation via the channels than desired notwithstanding being implanted at a low energy level.

Enhanced diffusion of boron refers to the unusually high diffusivity of boron even when minimum heat treatment is applied. The movement of boron due to an initial temperature treatment far exceeds the diffusion due to heat treatment alone. This is due to pairing of boron atoms with silicon interstials (e.g., silicon atoms that have been knocked off their positions from the silicon lattice structure). This pairing occurs in both horizontal and vertical directions, and occurs during the first heat treatment step. Thereafter, the Si interstitials recombine and no more Si interstitials are available for pairing with boron during subsequent heat treatment steps. Thus, during subsequent heat treatment steps, boron undergoes only normal thermal diffusion (and not enhanced diffusion).

Reduction of sheet resistance has been conventionally attempted by higher implant dosage levels. However, since channeling and enhanced diffusion lead to deeper junctions in the conventional approach, formation of shallower junctions is associated with reduction in dosage levels and peak concentration and hence higher sheet resistance. Moreover, limitations have been reached with respect to present implant equipment capabilities and boron's light atomic weight. Even with energy reduced down to the extent of today's technology at about 5 keV, the light boron atoms can still travel further than desired, (e.g., the normal distribution of a projected range) creating a junction deeper than desired. Moreover, suitable control of an implant beam becomes increasingly difficult to achieve as implant energy levels are reduced.

Thus, the difficulty in fabrication of p-type transistors results from the inherent limitations imposed by the characteristics of the Column III elements. As discussed above, channeling and enhanced diffusion will result in deeper than desired junctions, leading to degradation of short channel effects. However, to obtain shallower junctions using conventional techniques (having reduced dosage levels), the resulting junctions would have high sheet resistance which may lead to poor drive current characteristics. Consequently, there is a need in the art for a method to fabricate ultra-shallow p-type junctions with reduced dopant implant channeling effects and reduced enhanced diffusion of dopant implants and still provide for a p-type transistor having low sheet resistance.

SUMMARY OF THE INVENTION

The present invention provides for a method of producing ultra-shallow p-type junctions by mitigating dopant implant channeling effects and mitigating enhanced diffusion of dopant implants and providing for a p-type transistor having low sheet resistance.

An indium implanting step is performed prior to a p-type dopant implanting step (e.g., boron implanting step), and a subsequent silicon implanting step is performed after the p-type dopant implanting step—a p-type device results having a shallow junction and low sheet resistance. The indium implant mitigates channeling, and the silicon implant mitigates transient enhanced diffusion (TED) of the dopant. Contrary to conventional PMOS fabrication techniques where dopant concentration needs to be decreased to lower junction depth which increases sheet resistance, the indium and silicon implantation of the present invention affords for increasing an implant dopant concentration without resulting in a deeper junction, and providing lower sheet resistance as well.

Deeper junctions result in bad rolloff, make the device more difficult to control, and may result in punchthrough effects which are undesirable. However, the use of shallow junctions in conventional devices causes the series resistance to increase. The present invention avoids these negative effects because the addition of the indium and silicon dopants mitigates implant channeling effects and implant enhanced diffusion, respectively, which in turn provides for increasing implant dopant concentration without resulting in a deeper junction. As a result, a device results having a shallow junction and low effective series resistance as compared to conventional devices.

More specifically, the substantially uniform structure of silicon has channels existing within the silicon lattice structure. These channels provide for a p-type dopant to penetrate deeper in the silicon than desired via the channels. By implanting indium prior to implanting the p-type dopant, the silicon lattice is disrupted due to indium's heavy weight and size. As a result of the indium implant, the silicon becomes amorphized (e.g., substantially disrupted in structure) which destroys substantially all of the channels that previously existed within the silicon lattice. Thus, when the p-type dopant (e.g., boron) is subsequently implanted in the amorphous silicon the p-type dopant will not travel as deep in the silicon as in conventional methods because of the substantial elimination of channels.

Thereafter, a silicon implanting step is performed to increase vacancies within a projected range (Rp) of the silicon implant which will provide for reducing enhanced diffusion of the p-type dopant. More specifically, the vacancy excess created by the silicon implant will lie between the Si surface and 0.8 Rp of the silicon implant, which is the desired range for implanting of the dopant. Prior to the silicon implant step, a substantial number of silicon interstitials exist beyond the dopant profile because of the indium implanting step. The indium implanting step creates sufficient damage in the silicon crystal lattice to create an amorphous layer. The amorphous layer provides for containing substantially all the dopant implant therein. However, beyond the amorphous/crystalline interface into the silicon crystal there exists an interstitial excess because the indium implanting step knocks off many silicon atoms from their lattice site.

More particularly, the subsequent silicon implanting step results in the implanted silicon atoms knocking off additional silicon atoms off of the lattice within 0.8 Rp of the silicon implant. As the silicon atoms are knocked off of the lattice, vacancies open on the lattice within 0.0 Rp to 0.8 Rp of the silicon implant. The knocked off silicon atoms (e.g., silicon interstitials) from the silicon implanting step are driven via momentum and an avalanche-like effect deeper into the silicon beyond 0.8 Rp. As a result, there is an increased concentration of vacancies than concentration of interstitials within 0.0 to 0.8 Rp of the silicon implant; a substantially equal concentration of vacancies and interstitials within 0.8 Rp to 1.0 Rp; and an excess of interstitials to vacancies within 1.0 Rp to 2.0 Rp. The reduction of interstitial concentration between the surface and 0.8 Rp of the silicon implant mitigates enhanced diffusion of the p-type implants.

In accordance with one particular embodiment of the invention, a method for fabricating a p-type transistor includes implanting a heavy ion into a silicon substrate to create amorphous silicon within a predetermined range, the amorphous silicon providing for substantially containing a p-type dopant implant.

In accordance with another embodiment of the invention, a method of fabricating a p-type MOS transistor includes the steps of: providing an n-well region by masking a portion a silcion substrate with a photoresist layer and implanting n-well dopants; and forming a polygate structure on the n-well regions. The method further includes the steps of implanting indium into the n-well region wherein the indium implant amorphizes at least a portion of the silicon substrate; implanting a p-type implant into the amorphized silicon, wherein the amorphized silicon substantially contains the p-type implant; and implanting silicon into the n-well region to create an excess of vacancies to interstitials within a predetermined range, wherein enhanced diffusion of the p-type implant within the predetermined range is mitigated.

Still another embodiment of the invention provides for a p-type transistor, including an ultra shallow junction having low sheet resistance. The ultra shallow junction is formed via implantation of indium within an n-well region of the transistor so as to amorphize silicon within a first predetermined range, the amorphized silicon fully containing a subsequent p-type dopant implant; and implanting silicon after the p-type dopant implantation so as to increase an amount of vacancies over an amount of interstitials within a second predetermined range, wherein enhanced diffusion of the p-type dopant within the second predetermined range is mitigated due to the excess of vacancies to interstitials within the second predetermined range.

Yet another embodiment of the invention provides for a method of fabricating a transistor. According to the method, a heavy ion is implanted into a silicon substrate so as to amorphize at least a portion of the silicon substrate. The amorphized silicon is substantially free of channels. A dopant is subsequently implanted into the amorphized silicon, and the amorphized silicon substantially contains the implanted dopant. Thereafter, a silicon implanting step is performed to create an excess of vacancies to interstitials within a predetermined range. Enhanced diffusion of the dopant within the predetermined range is mitigated because of the excess of vacancies to interstitials within this predetermined range.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
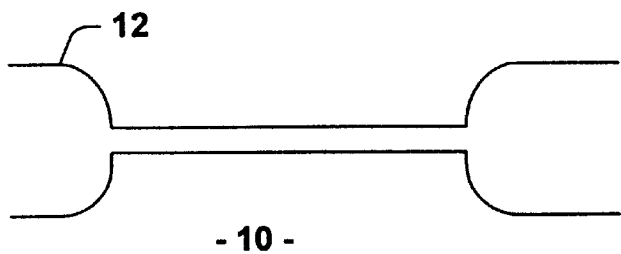
FIG. 1a is a schematic cross-sectional illustration of a p-substrate with field oxide regions in accordance with the present invention.

The present invention will now be described with reference to the drawings, wherein like reference numerals are used to refer to like elements throughout. The method of the present invention will be described with reference to the formation of a p-type transistor having source/drain (S/D) extension regions (i.e., lightly doped drain (LDD) regions). However, the method is applicable to other processes, for example, a process for forming Bipolar-CMOS transistors (commonly known as BiCMOS transistors) or any transistor technologies utilizing p-type transistors. Furthermore, the following detailed description is of the best mode presently contemplated by the inventors for practicing the invention. It should be understood that the description of this preferred embodiment is merely illustrative and that it should not be taken in a limiting sense.

The present invention provides for a method of fabricating a p-type transistor having shallow junctions and low sheet resistance. By employing an indium implanting step prior to p-type dopant implanting, dopant channeling effects are mitigated. Thereafter, by incorporating a silicon implanting step after the p-type dopant implanting step a reduction in enhanced diffusion of the dopant results as compared to conventional methods for fabricating p-type transistors.

Figure 1B:
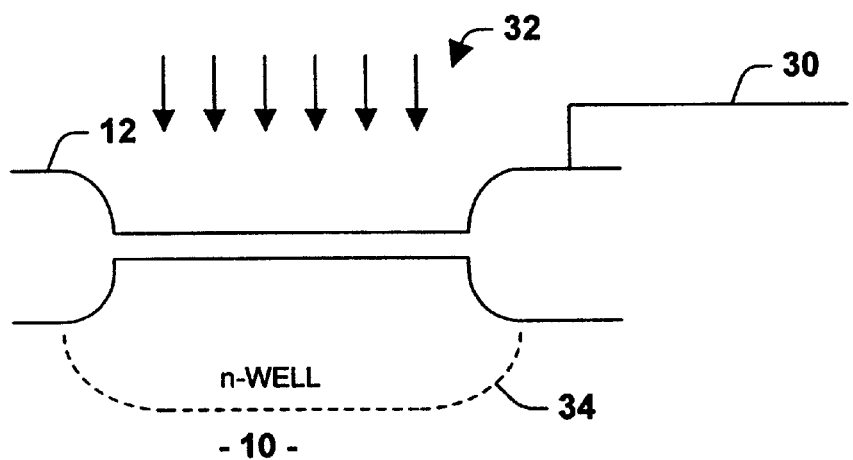
FIG. 1b is a schematic cross-sectional illustration of the formation of an n-well region in accordance with the present invention.
Figure 1C:
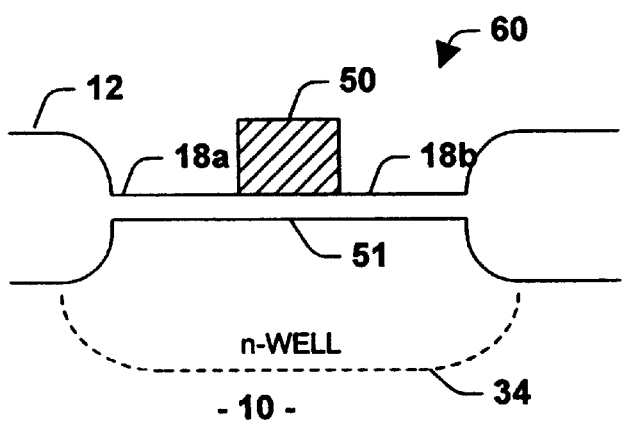
FIG. 1c is a schematic cross-sectional illustration of the formation of a polygate structure in accordance with the present invention.

Referring initially to FIGS. 1a–1i, one specific aspect of the present invention is shown with respect to a S/D extension process in connection with fabricating PMOS transistors. FIGS. 1a–1c show a p-type substrate (e.g., a silicon wafer) 10 having field oxide regions 12 formed thereon which serve as isolation barriers to define outer edges of active regions 18a, and 18b (FIG. 1c). The field oxide regions 12 may be formed using any suitable fabrication technique. FIG. 1b shows the formation of an n-well region by masking a portion of the substrate 10 with a photoresist layer 30 and implanting n-well dopants 32 to provide an n-well 34. Thin gate oxide 51 and polygate 50 structures are formed between the field oxide regions 12 to define inner edges of the active regions 18a and 18b. Active regions 18a, 18b and polygate 50 will respectively form drain, source and gate regions of the p-type transistor 60.

Figure 1D:
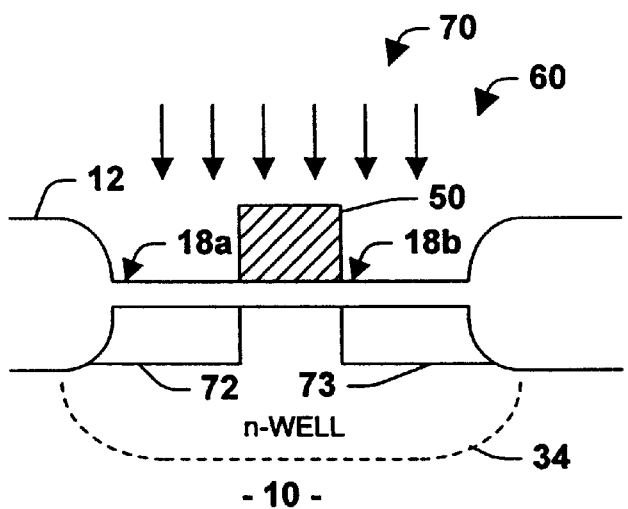
FIG. 1d is a schematic cross-sectional illustration of an indium implant step in accordance with the present invention.

FIG. 1d illustrates an indium implant step. An indium implant 70 is used to amorphize the silicon of the active portions 18a and 18b of the n-well region 34. The indium atoms 70 are large and heavy and provide for disrupting the silicon lattice structure so as to substantially eliminate a large portions of channels that previously existed due to the uniform nature of the silicon lattice. As noted above, the structure of silicon is such that a lattice structure thereof is very uniform and has channels within the silicon structure. Such channels allow for implants to pass therethrough to a depth within the silicon greater than desired. By disrupting the silicon lattice via the indium implant, the channels are substantially eliminated. As a result, a subsequent p-type dopant implant (e.g., boron) will not have channels to pass through and thus will not penetrate deeper into the silicon than desired.

Figure 1E:
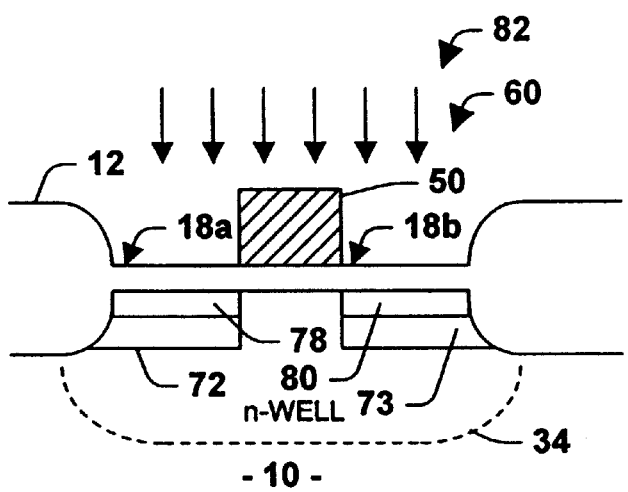
FIG. 1e is a schematic cross-sectional illustration of a p-type dopant implant step in accordance with the present invention.
Figure 2A:
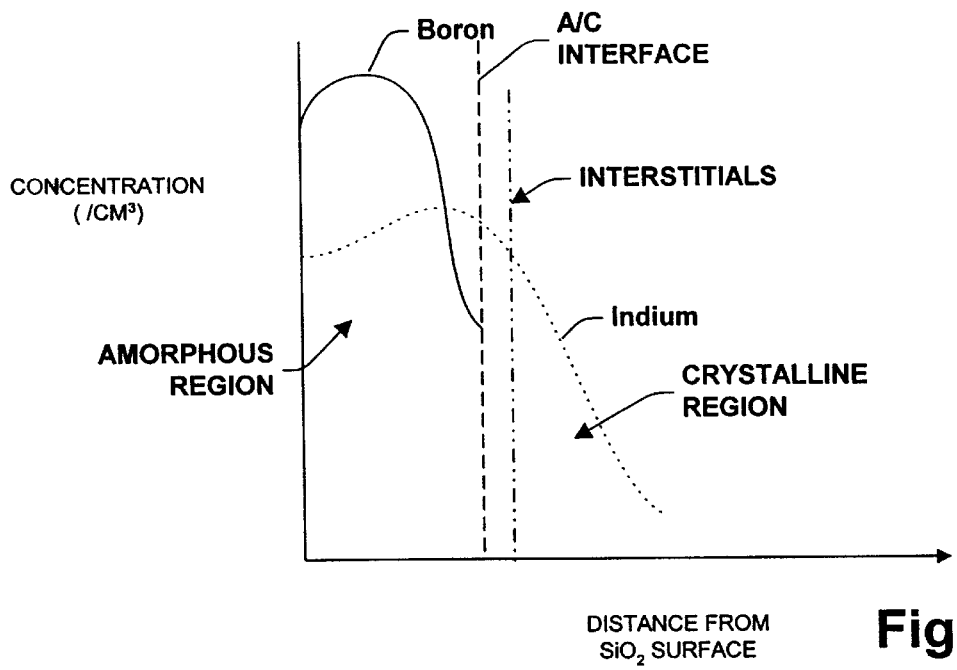
FIG. 2a is a graph of concentration versus depth (elevation) within the silicon/polysilicon areas shown in FIG. 1e after indium implantation and impurity implantation in accordance with the present invention.

In the preferred embodiment, the indium is implanted at a dose within the range of $1\times10^{14}$ to $1\times10^{15}$ cm$^2$ and within an energy range of about 1–30 KeV. Referring briefly to FIG. 2a, the energy of the indium implant is chosen such that amorphous portions 72 and 73 created by the implant are thick enough to fully contain the subsequent boron implant 82 (FIG. 1e). Indium is employed to amorphorize the silicon because of its heavy nature and its tendency to outdiffuse during heat treatment. A low amorphization threshold dose for indium will result in fewer end-of-range defects beyond the amorphous/crystalline (A/C) interface. Of course it will be appreciated that any suitable dose and energy range for implanting indium may be employed to carry out the present invention and is intended to fall within the scope of the invention as defined by the claims. Furthermore, it will be appreciated that any other suitable heavy ion (e.g., antimony) or combination thereof may be employed to carry out the present invention, and use thereof is intended to fall within the scope of the present invention as defined by the hereto appended claims.

Turning now to FIG. 1e, a p-type dopant (e.g., boron) 82 is implanted to form lightly doped regions 78 and 80. The p-type implant 82 is applied at a dose within the range of $1\times10^{13}$ to $1\times10^{15}$ cm$^2$ at an energy level of less than 15 KeV. Again, it will be appreciated that any suitable dose and energy range for the p-type dopant implant may be employed to carry out the present invention and is intended to fall within the scope of the subject invention as defined by the hereto appended claims. As can be seen, the p-type dopant is fully contained within the amorphous portions 72 and 73. FIG. 2a illustrates this aspect of the invention very clearly. As can be seen in the figure, a boron implant is fully contained with an amorphous region created by a heavy ion implant (e.g., indium). In other words, the heavy ion implant substantially eliminated any channels that previously existed within a predetermined range of the silicon substrate. This predetermined range is thus amorphized (e.g., channel free), and thus the subsequently implanted dopant (e.g., boron) will not travel beyond an amorphous/crystalline (A/C) interface.

The indium implantation 70 (FIG. 1d) creates the shallow amorphous portions of silicon 72 and 73 (e.g., substantially free of channels) to provide for containing the p-type implant 82 and mitigate any channeling thereof (FIG. 1e).

As noted above, the mitigation of p-type implant channeling facilitates fabrication of an ultra-shallow p-type junction. The indium implantation 70 (FIG. 1d) also would result in higher p-type implant activation during the subsequent RTA/Furnace annealization step (not shown). Thus, higher activation (lower sheet resistance) can be achieved at a lower annealing temperature.

Figure 1F:
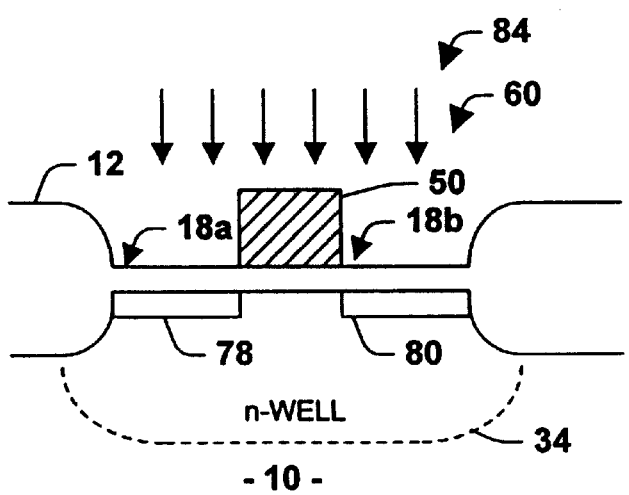
FIG. 1f is a schematic cross-sectional illustration of a silicon implant step in accordance with the present invention.
Figure 2B:
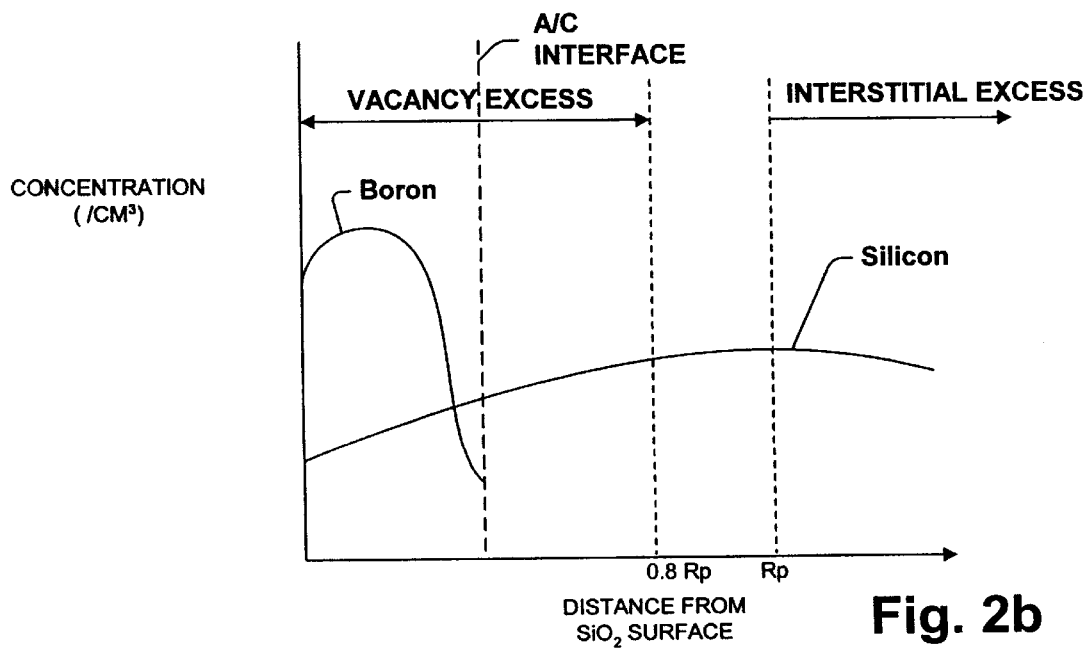
FIG. 2b is a graph of concentration versus depth (elevation) within the silicon/polysilicon areas shown in FIG. 1f after silicon implantation in accordance with the present invention.

After the p-type dopant implant step 82 the amorphized silicon is heated within the range of 550° C. to 650° C., the amorphized silicon portions 72 and 73 recrystallize to substantially uniform crystallized silicon—this is known as solid phase epitaxial growth. The recrystallization is performed because a p-type device will not function properly with the silicon in an amorphous state. Alternatively, the heating step may not be performed and the subsequent silicon implantation 84 may be performed directly after the p-type dopant implant. In this case, the recrystallization of silicon will take place during the first anneal step of the process. Next, a subsequent silicon implantation 84 is performed (FIG. 1f). Referring briefly to FIG. 2b, the silicon implantation 84 of sub-amorphous dose is performed such that the vacancy distribution of the silicon implantation 84 coincides with the interstitial distribution of the indium implantation 70 (FIG. 1d) beyond the A/C interface.

The silicon implanting step is performed to increase vacancies within a desired range of the silicon which will provide for reducing enhanced diffusion of the p-type dopant. More specifically, the desired depth for implanting the p-type dopant may be between the silicon surface and 0.8 Rp of the silicon implant, for example. It is to be appreciated that the desired depth and corresponding implant dosage and energy levels may be tailored as desired. As noted above, prior to the silicon implant step 84, a substantial number of silicon interstitials exist within the desired range (0.0 to 0.8 Rp of the silicon implant) largely because of the indium implanting step 70 which knocked off numerous silicon atoms off of the silicon lattice. The subsequent silicon implanting step 84 results in the implanted silicon atoms knocking off silicon atoms off of the lattice within the desired depth range of the p-type implant (0.0 to 0.8 Rp of the silicon implant). As the silicon atoms are knocked off of the silicon lattice, vacancies open on the lattice. The knocked off silicon atoms (i.e., silicon interstitials) are driven via momentum and domino-like effect with other silicon atoms deeper into the silicon (0.8 Rp to 2.0 Rp) beyond the desired depth for the p-type implant. As a result, there is an increased concentration of vacancies than concentration of interstitials within the desired p-type implant range (e.g., 0.0 to 0.8 Rp of the silicon implant). See FIG. 2b. This reduction of interstitial concentration within this desired range mitigates enhanced diffusion of the p-type implants (e.g., boron). Thus, the silicon implantation 84 mitigates transient enhanced diffusion (TED) of the p-type dopant by creating vacancies which reduce the amount of interstitials available to promote TED of the p-type implant.

Referring back to FIG. 1f, the silicon implantation 84 is applied at a dose of less than $1 \times 10^{15}$ cm$^2$ and at an energy level of less than 150 KeV. The energy of the silicon implantation 84 is chosen to reduce the amount of silicon interstitials available to interact with the p-type dopant 70 (FIG. 1d) within the desired range (e.g., 0.0 to 0.8 Rp of the silicon implant). As a result, enhanced diffusion of the p-type dopant is mitigated.

The implantation of the indium 70 as represented in FIG. 1d and the implantation of the silicon 84 as represented in FIG. 1f result in reduced channeling and reduced transient enhanced diffusion (TED) of the p-type dopant 82 (e.g., boron), respectively. As mentioned above, channeling and enhanced diffusion result in deeper than desired junctions which may lead to adverse short channel effects that may degrade transistor performance. The indium 70 and silicon 84 implantation steps of the present invention provide for employing increased p-type dopant levels without resulting in a deeper junction. The implantation of indium and silicon avoids these negative effects because the indium and silicon prevents a conventional p-type dopant such as boron from increasing the depth of the junction. Thus, the present invention provides for a device having a shallow junction, and low effective series resistance as compared to conventional devices due to a higher concentration of dopant implant within a predetermined range.

Figure 1G:
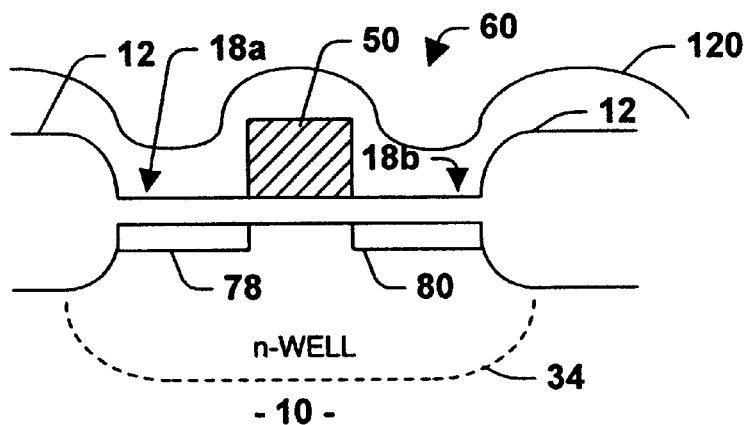
FIG. 1g is a schematic cross-sectional illustration of a spacer formation step in accordance with the present invention.
Figure 1H:
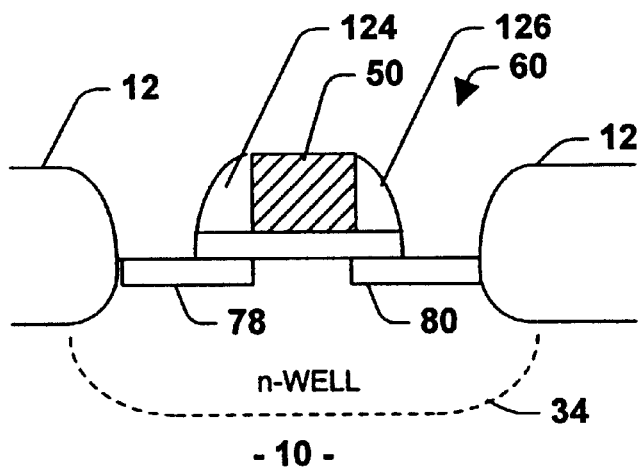
FIG. 1h is a schematic cross-sectional illustration of a spacer formation in accordance with the present invention.
Figure 1I:
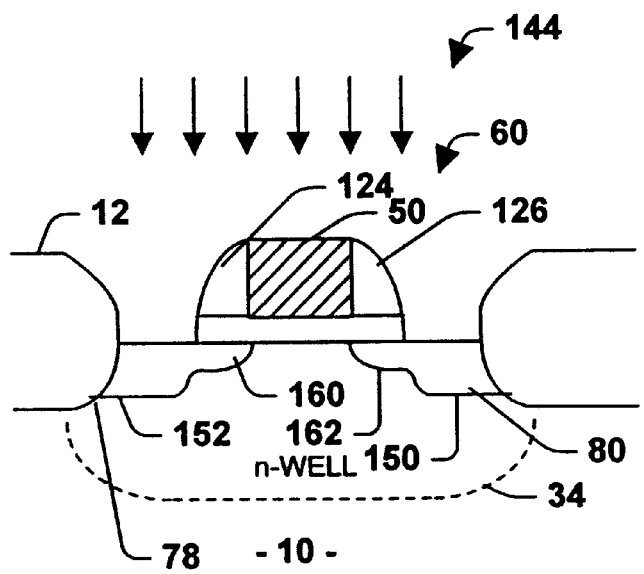
FIG. 1i is a schematic cross-sectional illustration of an $p^+$_ implant step in accordance with the present invention.

Portions of the lightly doped regions 78, and 80 will become the S/D extension regions of a PMOS transistor formed on the p-substrate 10. After the indium implantation 70 (FIG. 1d) and the silicon implantation 84 (FIG. 1f), PMOS fabrication steps are continued as is shown in FIGS. 1g–1i. In FIG. 1g, a silicon spacer material layer 120 is formed over the p-substrate 10. The spacer material layer 120 may be formed of silicon dioxide (SiO$_2$), for example. The spacer material layer 120 may be formed of other materials provided that the selected materials may be selectively etched with respect to each other.

An etchant which selectively etches the spacer material layer 120 (i.e., etches the spacer material layer 120 at a faster rate than the silicon substrate), may be used to etch spacer material layer 120 until only spacers 124 and 126 remain at the ends of gate 50 and as shown in FIG. 1h.

After the formation of spacers 124, an another ion implant step is performed as shown in FIG. 1i. A p$^+$ implant 144 is performed to form p$^+$ source region 150 and p$^+$ drain region 152 in portions of the lightly doped regions 80 and 78, respectively. Spacers 124 and 126 serve as masks to prevent ion implantation in the portions of lightly doped regions 78 and 80 underlying spacers 124 and 126. These protected portions of the lightly doped regions 78 and 80 are the respective LDD region 160 and lightly doped source ("LDS") region 162 of the p-type transistor. Standard silicide is formed on the drain, source and polygate. The process is thus complete in relevant part.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a p-type transistor, comprising the steps of:

implanting indium into a silicon substrate to create amorphous silicon within a predetermined range, the amorphous silicon facilitating containing a p-type dopant implant;

implanting the p-type dopant after implanting the indium; and implanting silicon to generate an excess of vacancies over interstitials within a desired range so as to mitigate enhanced diffusion of the p-type dopant.

2. The method of claim 1 further including the step of implanting the the indium at a dose within a range of $1 \times 10^{14}$ to $1 \times 10^{15}$ cm$^2$.

3. The method of claim 1, the p-type dopant being implanted at a depth ranging from 0.0 to 0.8 Rp of the subsequent silicon implant.

4. The method of claim 3 wherein the indium is implanted at an energy level within a range of about 1–30 KeV.

5. The method of claim 2, wherein the p-type dopant is implanted at a dose within a range of $1\times10^{13}$ to $1\times10^{15}$ cm$^2$.

6. The method of claim 2 wherein the p-type dopant is implanted at an energy level within a range of less than about 15 KeV.

7. The method of claim 1, wherein the silicon is implanted at a dose of less than about $1\times10^{15}$ cm$^2$.

8. The method of claim 1 wherein the silicon is implanted at an energy level within a range of less than about 150 KeV.

9. The method of claim 1, wherein the p-type dopant is boron.

10. A method of fabricating a p-type MOS transistor, comprising the steps of:

providing an n-well region by masking a portion a silicon substrate with a photoresist layer and implanting n-well dopants;

forming a polygate structure on the n-well regions;

implanting indium into the n-well region wherein the indium implant amorphizes at least a portion of the silicon substrate;

implanting a p-type implant into the amorphized silicon, wherein the amorphized silicon substantially contains the p-type implant; and implanting silicon into the n-well region to create an excess of vacancies to interstitials within a predetermined range, wherein enhanced diffusion of the p-type implant within the predetermined range is mitigated.

11. The method of claim 10, wherein the indium is implanted at a dose within a range of $1\times10^{14}$ to $1\times10^{15}$ cm$^2$.

12. The method of claim 10 wherein the indium is implanted at an energy level within a range of about 1–30 KeV.

13. The method of claim 10, wherein the p-type dopant is implanted at a dose within a range of $1\times10^{13}$ to $1\times10^{15}$ cm$^2$.

14. The method of claim 10 wherein the p-type dopant is implanted at an energy level within a range of less than about 15 KeV.

15. The method of claim 10, wherein the silicon is implanted at a dose of less than about $1\times10^{15}$ cm$^2$.

16. The method of claim 10 wherein the silicon is implanted at an energy level within a range of less than about 150 KeV.

17. The method of claim 10, wherein the p-type dopant is boron.

18. A method of fabricating a transistor, comprising the sequential steps of:

implanting a heavy ion into a silicon subtrate so as to amorphize at least a portion of the silicon substrate to mitigate the presence of channels;

implanting a dopant into the amorphized silicon, wherein the amorphized silicon facilitates containing the implanted dopant; and implanting silicon to create an excess of vacancies to interstitials within a desired range to reduce enhanced diffusion of the dopant.

19. The method of claim 18, wherein a low temperature anneal step is performed prior to the silicon implant step.

20. The method of claim 19, wherein the anneal step is performed within a temperature range of about 550° C. to 600° C.

* * * * *

UNITED STATES PATENT AND TRADEMARK OFFICE
CERTIFICATE OF CORRECTION

PATENT NO.: 6,063,682

DATED: May 16, 2000

INVENTOR(S): Sultan, *et al.*

It is certified that error appears in the above-identified patent and that said Letters Patent is hereby corrected as shown below:

In claim 2: Please replace "the the" with --the--.

Signed and Sealed this

Twentieth Day of March, 2001

*Attest:*

NICHOLAS P. GODICI

*Attesting Officer*    *Acting Director of the United States Patent and Trademark Office*